(12) United States Patent
Han et al.

(10) Patent No.: US 11,058,033 B2
(45) Date of Patent: Jul. 6, 2021

(54) RECEPTACLE ASSEMBLY AND THERMAL-TRANSFER ASSEMBLY

(71) Applicants: TE CONNECTIVITY CORPORATION, Berwyn, PA (US); Tyco Electronics (Shanghai) Co., Ltd., Shanghai (CN)

(72) Inventors: Hongqiang Han, Shanghai (CN); Jiwang Jin, Shanghai (CN); Wenyu Liu, Shanghai (CN); Nikhil Shankar, New York, NY (US); Alex Michael Sharf, Harrisburg, PA (US); Chenxi Wang, Shanghai (CN)

(73) Assignees: TE CONNECTIVITY CORPORATION, Berwyn, PA (US); TYCO ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/581,796

(22) Filed: Sep. 25, 2019

(65) Prior Publication Data

US 2020/0022283 A1 Jan. 16, 2020

Related U.S. Application Data

(63) Continuation of application No. 15/959,973, filed on Apr. 23, 2018, now Pat. No. 10,477,729.

(30) Foreign Application Priority Data

Jan. 23, 2018 (CN) .............................. 201810066104

(51) Int. Cl.
*H05K 7/20* (2006.01)
*H05K 7/14* (2006.01)
(Continued)

(52) U.S. Cl.
CPC ........... *H05K 7/20418* (2013.01); *F28F 3/06* (2013.01); *F28F 9/001* (2013.01); *G02B 6/4269* (2013.01);
(Continued)

(58) Field of Classification Search
CPC ............. H05K 7/20418; H05K 7/1401; H05K 7/20154; F28F 3/06; F28F 9/001;
(Continued)

(56) References Cited

U.S. PATENT DOCUMENTS 5,558,155 A * 9/1996 Ito ........................ B23K 1/0012
165/185
6,280,222 B1 8/2001 Walkup
(Continued)

FOREIGN PATENT DOCUMENTS

CN 2458750 Y 11/2001
CN 2696123 Y 4/2005
(Continued)

OTHER PUBLICATIONS

SFF Committee "SFF-8436 Specification for QSFP+ 10 Gbs 4X Pluggable Transceiver Standardized as EIA-964 at Rev 4.8" Oct. 2013 (pp. 1-3, 8, 9, and 37-40).
(Continued)

*Primary Examiner* — Justin M Jonaitis

(57) ABSTRACT

Receptacle assembly includes a receptacle cage and a thermal-transfer module that is coupled to a thermal side of the receptacle cage. The thermal-transfer module has a base portion and a plurality of heat-transfer fins coupled to the base portion. The thermal-transfer module is configured to absorb thermal energy from a pluggable transceiver in the receptacle cage and transfer the thermal energy through the base portion and to the heat-transfer fins. The receptacle assembly also includes a retention clip configured to hold
(Continued)

the thermal-transfer module to the receptacle cage. The retention clip includes a resilient beam that extends across the thermal-transfer module. The resilient beam directly engages at least some of the heat-transfer fins and applies a resilient force against the heat-transfer fins.

20 Claims, 9 Drawing Sheets

(51) Int. Cl.
| | | |
|---|---|---|
| *F28F 3/06* | (2006.01) | |
| *F28F 9/00* | (2006.01) | |
| *H04B 10/40* | (2013.01) | |
| *G02B 6/42* | (2006.01) | |

(52) U.S. Cl.
CPC ........... *H04B 10/40* (2013.01); *H05K 7/1401* (2013.01); *F28F 2275/085* (2013.01); *H05K 7/20154* (2013.01)

(58) Field of Classification Search
CPC ... F28F 2275/085; F28F 2280/00; F28D 1/06; F28D 2021/0028; F28D 2021/0029; H01L 23/40; H01L 23/46; H01L 23/467
USPC ...................................... 165/80.3, 80.1, 80.2
See application file for complete search history.

(56) References Cited

U.S. PATENT DOCUMENTS

| | | | |
|---|---|---|---|
| 6,362,965 | B2 | 3/2002 | Bookhardt et al. |
| 6,373,704 | B1 | 4/2002 | Chen |
| 6,978,827 | B2 | 12/2005 | Armstrong |
| 7,457,126 | B2 | 11/2008 | Ahrens |
| 7,529,094 | B2 | 5/2009 | Miller |
| 7,539,018 | B2 | 5/2009 | Murr et al. |
| 8,327,921 | B2 | 12/2012 | Zha |
| 8,449,331 | B2 | 5/2013 | Phillips et al. |
| 8,599,559 | B1 | 12/2013 | Morrison et al. |
| 9,160,090 | B2 * | 10/2015 | Su .................... H01R 12/7082 |
| 9,277,673 | B2 | 3/2016 | Droesbeke |
| 9,325,100 | B2 | 4/2016 | Hirschy |
| 9,343,851 | B2 | 5/2016 | Bucher et al. |
| 9,793,648 | B2 | 10/2017 | Regnier et al. |
| 9,882,297 | B2 | 1/2018 | Regnier |
| 9,980,411 | B2 | 5/2018 | Yang et al. |
| 10,477,729 | B2 * | 11/2019 | Han ........................ F28F 3/06 |
| 2004/0027816 | A1 | 2/2004 | Ice |
| 2004/0166712 | A1 | 8/2004 | Chou |
| 2004/0200600 | A1 * | 10/2004 | Chen .................. H01L 23/4093 |
| | | | 165/80.3 |
| 2005/0195565 | A1 | 9/2005 | Bright |
| 2005/0257532 | A1 | 11/2005 | Ikeda |
| 2006/0039115 | A1 | 2/2006 | Muroki |
| 2006/0266500 | A1 * | 11/2006 | Lin .......................... F28F 1/32 |
| | | | 165/104.33 |
| 2007/0012430 | A1 | 1/2007 | Duke |
| 2007/0183128 | A1 | 8/2007 | Pirillis et al. |
| 2010/0020494 | A1 | 1/2010 | Guo et al. |
| 2013/0077253 | A1 | 3/2013 | Macall |
| 2015/0280368 | A1 | 10/2015 | Bucher |

FOREIGN PATENT DOCUMENTS

| | | | |
|---|---|---|---|
| CN | 2706864 | Y | 6/2005 |
| CN | 101094582 | A | 12/2007 |
| CN | 101123860 | A | 2/2008 |
| CN | 201222842 | Y | 4/2009 |
| CN | 101641001 | A | 2/2010 |
| CN | 101641003 | A | 2/2010 |
| CN | 103094764 | A | 5/2013 |
| CN | 203839574 | U | 9/2014 |
| CN | 104364974 | A | 2/2015 |
| CN | 105390860 | A | 3/2016 |
| CN | 105474474 | A | 4/2016 |
| EP | 0735810 | A2 | 10/1996 |

OTHER PUBLICATIONS

Yamaichi Electronics Co., Ltd. "CFP2 Heatsink Clip Part No. CN121M-104-0008" 2013 (1 page).
Yamaichi Electronics Co., Ltd. "CFP2 Heatsink Part No. CN121F-104-0001" 2013 (1 page).
Yamaichi Electronics Co., Ltd. "The Future of 100GbE Technology" 2012 (2 pages).
Yamaichi Electronics Co,, Ltd. "Series CN121 CFP2 Mechanical Unit and Connectors (Dual Slot)" Nov. 2013 (2 pages).
Yamaichi Electronics Co., Ltd. "High-Speed Data Networking Solutions" Mar. 2017 (40 pages).
Application Specification 114-13217 for "QSFP Thru Bezel Cage Assembly, Heat Sink, and Light Pipe." Jul. 29, 2013 (10 pages).
Online catalog of Alpha Novatech for heat sinks to transceiver modules, downloaded from: https://www.alphanovatech.com/en/cat_fpa.html (2 pages).
Raghupathy, Arun P., et al. "Validation studies of DELPHI-type Boundary-Condition-Independent Compact Thermal Model for an opto-electronic package." 2009 15th International Workshop on Thermal Investigations of ICs and Systems. IEEE, 2009. (8 pages).
Specification for Yamaichi CFP8 Heat Sink (CN168F-124-0004), Apr. 24, 2017 (1 page) accessible from http://ypl.yeu.com/connectors/cfp-cfp2-cfp4-connectors-and-accessories and downloaded from https://docs.google.com/a/yeu.com/viewer?a=v&pid=sites&srcid=eWV1LmNvbXx5cGx8Z3g6N2FmZDBjOWMyMWQwNDE3NA.

* cited by examiner

RECEPTACLE ASSEMBLY AND THERMAL-TRANSFER ASSEMBLY

CROSS-REFERENCE TO RELATED APPLICATION

The present application is a continuation of U.S. application Ser. No. 15/959,973, filed on Apr. 23, 2018, which claims the benefit of China Application No. 201810066104.0, filed on Jan. 23, 2018. Each of these applications is incorporated by reference in its entirety.

BACKGROUND OF THE INVENTION

The subject matter herein relates generally to receptacle assemblies that are configured to receive pluggable transceivers and, more specifically, to receptacle assemblies that have heat sinks for dissipating thermal energy.

Communication systems exist today that utilize plug and receptacle assemblies to transmit data. For example, network systems, servers, data centers, and the like may use plug and receptacle assemblies to interconnect the various devices of the communication system. A plug and receptacle assembly includes a cable assembly having a pluggable transceiver and a receptacle assembly. The receptacle assembly is designed to receive the pluggable transceiver. The receptacle assembly is typically mounted to a circuit board having one or more integrated circuits, processors, or the like that communicate with the pluggable transceiver through an electrical connector the receptacle assembly.

The plug and receptacle assembly includes signal pathways and ground pathways in which the signal pathways convey data signals and the ground pathways control impedance and reduce crosstalk between the signal pathways. The pluggable transceivers and receptacle assemblies may be configured to transfer electrical signals in accordance with industry standards. By way of example, known industry standards include small-form factor pluggable (SFP), enhanced SFP (SFP+), quad SFP (QSFP), C form-factor pluggable (CFP), and 10 Gigabit SFP, which is often referred to as XFP. These and similar communication systems are referred to herein as SFP-type systems. The pluggable transceivers and receptacle assemblies may be capable of implementing one or more communication protocols. Non-limiting examples of communication protocols that may be implemented include Ethernet, Fibre Channel, InfiniBand, and Synchronous Optical Networking (SONET)/Synchronous Digital Hierarchy (SDH). Pluggable transceivers may be, for example, a direct attach copper (DAC), an active optical cable (AOC), or an optical transceiver (Txcvr).

For many communication systems, such as the SFP-type systems, the receptacle assembly is also designed to absorb thermal energy from the pluggable transceiver and permit the thermal energy to dissipate into the surrounding environment. The receptacle assembly includes a receptacle cage that is designed to receive the pluggable transceiver during a mating operation. The receptacle assembly also includes a thermal-transfer module, which may be referred to as a heat sink, that is positioned along a side of the receptacle cage and includes projections (e.g., pins) that extend into the surrounding environment. The projections receive thermal energy absorbed from the pluggable transceiver and permit the thermal energy to dissipate into the surrounding environment.

Known thermal-transfer modules have been effective in transferring thermal energy from the plug and receptacle assemblies. There is a desire, however, to increase the speed and signal lane density of plug and receptacle assemblies. For example, current SFP-type systems may be configured to transfer data at 25 gigabits per second (Gbps). More recently developed systems are capable of transferring data at 50 Gbps or more, and it is predicted that transfer speeds will continue to increase. At the same time, signal lane density has increased. As the transfer speeds and signal lane densities increase, however, the thermal energy generated by the system also increases. Current thermal-transfer modules may not be capable of sufficiently transferring the thermal energy generated by the more recently developed communication systems. Systems that are not capable of sufficiently transferring the thermal energy are more vulnerable to performance issues, including failure.

Accordingly, there is a need for a receptacle assembly that is capable of transferring thermal energy away from the pluggable transceiver at a rate greater than rates achieved by conventional receptacle assemblies.

BRIEF DESCRIPTION OF THE INVENTION

In one embodiment, a receptacle assembly is provided. The receptacle assembly includes a receptacle cage having a front end and a receiving cavity that opens to the front end. The receiving cavity is sized and shaped to receive a pluggable transceiver. The receptacle assembly also includes a thermal-transfer module that is coupled to a thermal side of the receptacle cage. The thermal-transfer module has a base portion and a plurality of heat-transfer fins coupled to the base portion. The thermal-transfer module is configured to absorb thermal energy from the pluggable transceiver and transfer the thermal energy through the base portion and to the heat-transfer fins. The heat-transfer fins have corresponding fin heights that extend between the base portion and a corresponding distal surface. The receptacle assembly also includes a retention clip configured to hold the thermal-transfer module to the receptacle cage. The retention clip includes a resilient beam that extends across the thermal-transfer module. The resilient beam directly engages at least some of the heat-transfer fins and applies a resilient force against the heat-transfer fins in a direction from the distal surfaces to the receptacle cage.

In some aspects, the heat-transfer fins may have respective thicknesses that are at most 0.40 mm.

In some aspects, the distal surfaces of the heat-transfer fins may be shaped to form depressed segments and elevated segments. The fin height along the elevated segment may be greater than the fin height along the depressed segment. The depressed segments may collectively form a valley of the thermal-transfer module. The resilient beam may extend through the valley.

In some aspects, the resilient beam directly may engage the distal surfaces and applies the resilient force to the distal surfaces.

In some aspects, the heat-transfer fins include an upright section that extends away from the receptacle cage and a folded section that extends transverse to the upright section. The folded section includes at least a portion of the distal surface. The resilient force is applied to the folded sections of the heat-transfer fins. Optionally, the folded section of at least one heat-transfer fins interlocks with one or more of the nearby heat-transfer fins. The nearby heat-transfer fins may be at most three positions away from the heat-transfer fin with the folded section. Also optionally, for at least a series of the heat-transfer fins, the folded section for each of the heat-transfer fins in the series interlocks with one or more of the nearby heat-transfer fins in the series. The folded sections may be aligned with one another. The resilient beam may extend over the folded sections.

In some aspects, the heat-transfer fins include ribs that extend from the base portion toward the distal surfaces. The ribs may resist deformation of the heat-transfer fins caused by the resilient force.

In an embodiment, a thermal-transfer assembly is provided that includes a thermal-transfer module configured to be coupled to a device. The thermal-transfer module has a base portion and a plurality of heat-transfer fins coupled to the base portion. The thermal-transfer module is configured to absorb thermal energy from the device and transfer the thermal energy from the device, through the base portion, and to the heat-transfer fins. The heat-transfer fins have corresponding heights that extend from the base portion to corresponding distal surfaces. The thermal-transfer assembly also includes a retention clip configured to hold the thermal-transfer module to the device. The retention clip includes a resilient beam that extends across the thermal-transfer module. The resilient beam directly engages at least some of the heat-transfer fins and applies a resilient force against the heat-transfer fins in a direction from the distal surfaces to the device.

In some aspects, the heat-transfer fins have a thickness that is at most 0.40 mm.

In some aspects, distal surfaces of the heat-transfer fins form depressed segments and elevated segments. The fin height along the elevated segment is greater than the fin height along the depressed segment. The depressed segments of the plurality of heat-transfer fins collectively form a valley of the thermal-transfer module. The resilient beam extending through the valley.

In some aspects, the resilient beam is configured to directly engage the distal surfaces and apply the resilient force to the distal surfaces.

In some aspects, the heat-transfer fins include an upright section that extends away from the device and a folded section that extends transverse to the upright section. The folded section includes at least a portion of the distal surface, wherein the resilient force is applied to the folded sections of the heat-transfer fins.

In some aspects, the heat-transfer includes ribs that extend from the base portion toward the distal surfaces. The ribs resist deformation of the heat-transfer fins caused by the resilient force.

In some aspects, the thermal-transfer assembly also includes a thermal-transfer bridge. The thermal-transfer bridge conducts thermal energy to or from the thermal-transfer module.

In one embodiment, a receptacle assembly is provided. The receptacle assembly includes a receptacle cage having a front end and a receiving cavity that opens to the front end. The receiving cavity is sized and shaped to receive a pluggable transceiver. The receptacle assembly also includes a thermal-transfer module that is coupled to a thermal side of the receptacle cage. The thermal-transfer module has a base portion and a plurality of heat-transfer fins coupled to the base portion. The thermal-transfer module is configured to absorb thermal energy from the pluggable transceiver and transfer the thermal energy through the base portion and to the heat-transfer fins. The heat-transfer fins have corresponding fin heights that extend between the base portion and a corresponding distal surface. The heat-transfer fins having thicknesses that are at most 0.40 mm. The receptacle assembly also includes a retention clip configured to hold the thermal-transfer module to the receptacle cage. The retention clip includes a resilient beam that extends across the thermal-transfer module. The resilient beam applies a resilient force against the thermal-transfer module to the receptacle cage.

DETAILED DESCRIPTION

Embodiments set forth herein include thermal-transfer modules and assemblies, receptacle assemblies that include the thermal-transfer modules, and communication systems having the same. The receptacle assemblies and communication systems may be configured to receive pluggable transceivers. The thermal-transfer modules are configured to transfer thermal energy away from a device, such as an electronic device. The electronic device may conduct power and/or process signals. The electronic device may be, for example, an integrated circuit or a receptacle assembly that receives a pluggable transceiver. The receptacle assemblies include a receptacle cage having the thermal-transfer module. The thermal-transfer module is coupled to a side of the receptacle cage. The pluggable transceiver is sized and shaped to be inserted into a receiving cavity of the receptacle cage and mate with an electrical connector of the receptacle assembly. The thermal-transfer module is configured to absorb thermal energy generated by the pluggable transceiver and/or the internal connector and transfer the thermal energy away to the surrounding environment.

In some embodiments, the thermal-transfer module directly engages a surface of the electronic device. For example, the thermal-transfer module may directly engage a surface of an integrated circuit or a pluggable transceiver. For example, the receptacle cage has an opening along the side that permits a portion of the thermal-transfer module to extend into the receiving cavity. As the pluggable transceiver is inserted into the receiving cavity, the pluggable transceiver engages the thermal-transfer module such that the thermal-transfer module slides along a side of the pluggable transceiver. Such configurations may be referred to as riding thermal-transfer module. In other embodiments, the thermal-transfer module is thermally coupled to the pluggable transceiver through one or more elements, such as a wall of the receptacle cage.

For embodiments in which the thermal-transfer module transfer thermal energy away from an integrated circuit or similar device, the thermal-transfer module may be positioned along a surface of the device or along a surface that is thermally coupled to the device. Optionally, a retention clip may be used to press the thermal-transfer module toward the surface.

The thermal-transfer modules include heat-transfer fins that extend parallel to one another along a side of the receptacle cage. Adjacent heat-transfer fins have gaps therebetween that allow airflow. For example, the heat-transfer fins may extend longitudinally from a front end of the receptacle cage toward a back end. Alternatively, the heat-transfer fins may extend laterally from one side of the receptacle cage to an opposite side. One or more nearby fans may be configured to direct air through the gaps. The air absorbs thermal energy from the heat-transfer fins and transfers the thermal energy away from the receptacle assembly.

Figure 6:
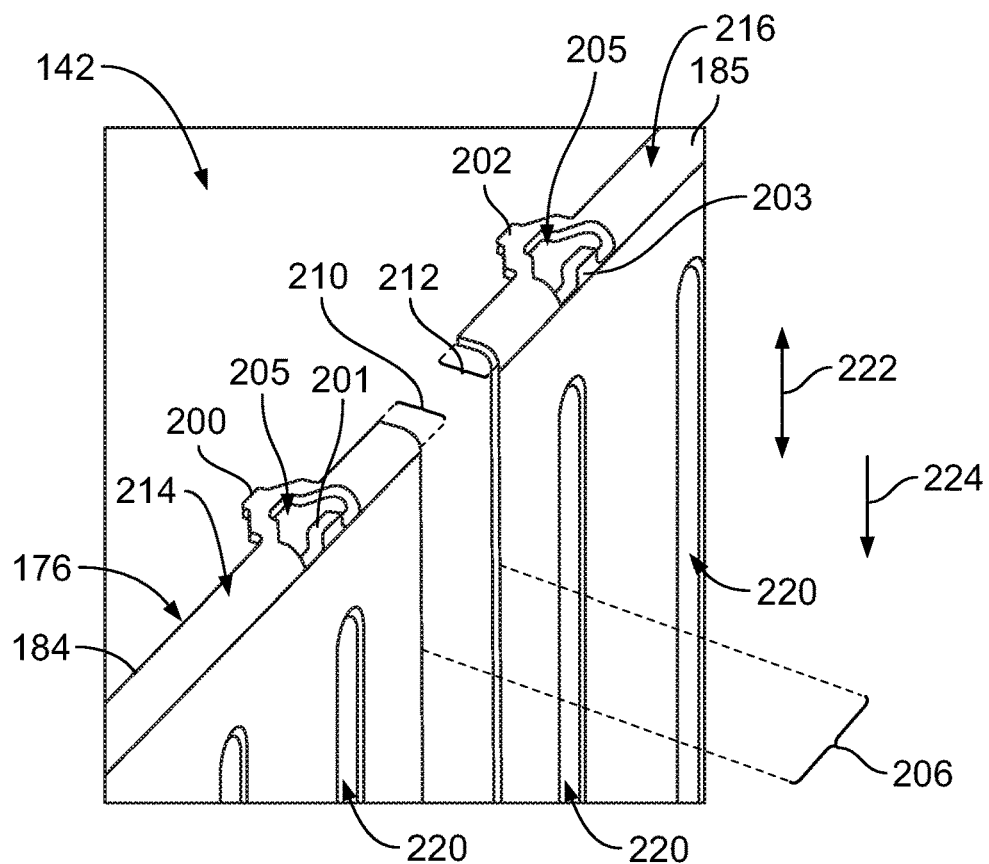
FIG. 6 is an enlarged view of a portion of the heat-transfer fin that may be used with the receptacle assembly of FIG. 1.

The heat-transfer fins may have thicknesses that are substantially less than the diameters of conventional pins or thicknesses of known fins. A heat-transfer thickness 208 is shown in FIG. 6. Such heat-transfer fins may allow a greater total number of heat-transfer fins and/or pitch without impeding airflow. In some embodiments, the heat-transfer fins have a thickness that is at most 0.50 millimeters (mm). In certain embodiments, the heat-transfer fins have a thickness that is at most 0.40 mm. In particular embodiments, the heat-transfer fins have a thickness that is at most 0.35 mm. In more particular embodiments, the heat-transfer fins have a thickness that is at most 0.30 mm or, even more particularly, at most 0.25 mm. In other embodiments, however, the heat-transfer fins have a thickness that is greater than 0.50 mm. The heat-transfer fins in such embodiments may be manufactured by machining, extrusion, diecasting, or other methods.

The heat-transfer fins, including those having thicknesses that are at most 0.40 mm or at most 0.25 mm, may be manufactured through a number of methods. For example, the heat-transfer fins may be manufacturing using at least one of a bonding process, a skiving or scarfing process, an interlocking process, or a folding process. Bonded heat-transfer fins include discrete fins that are secured to a common base portion. Each of the heat-transfer fins may be stamped from sheet metal and attached to the base portion. The base portion may be machined or extruded to include, for example, slots that receive the heat-transfer fins. The heat-transfer fins may be attached by an adhesive, through welding, through soldering, or other attachment methods. Skived fins are discrete heat-transfer fins that are thin slices from a base material. In such embodiments, the heat-transfer fins and the base portion may be portions of the same piece of material. In other words, the heat-transfer fins may never be separate from the base portion during the manufacturing process. As such, a subsequent step for attaching the heat-transfer fins to the base portion is not needed.

Interlocked-fin embodiments may also include discrete heat-transfer fins that are directly attached to one another. For example, a portion of one heat-transfer fin may be folded to grip or otherwise directly attach to at least one other nearby heat-transfer fin. A nearby heat-transfer fin is one that is at most three positions from the relevant heat-transfer fin. For example, a series of heat transfer fins may include, in order, a first heat-transfer fin, a second heat-transfer fin, a third heat-transfer fin, a fourth heat-transfer fin, a fifth heat-transfer fin, a sixth heat-transfer fin, and a seventh heat-transfer fin. The heat-transfer fins that are "nearby" the third heat-transfer fin one side are the first and second heat-transfer fins. On the other side, the nearby heat-transfer fins are the fourth, fifth, and sixth heat-transfer fins. The seventh heat-transfer fin is not nearby the third heat-transfer fin. Accordingly, the third heat-transfer fin may have a portion that is shaped (e.g., folded or bent) to interlock with at least one of the fourth, fifth, or sixth heat-transfer fins. As such, each heat-transfer fin in a series may be directly attached to at least one other nearby heat-transfer fin.

In particular embodiments, a portion of a heat-transfer fin is shaped to interlock with the adjacent heat-transfer fin. "Adjacent" heat-transfer fins are the nearest heat-transfer fins on either side. For instance, from the above example, the second heat-transfer fin and the fourth heat-transfer fin are adjacent to the third heat-transfer fin.

Folded-fin embodiments may be shaped from a common sheet of material (e.g., sheet metal). More specifically, the sheet is folded in a wave-like manner such that each fin extends between a crest and a trough. The troughs may then be bonded to a base portion using an adhesive, a metallurgical bond (e.g., soldering or welding), or through other attachment methods.

Optionally, the heat-transfer fins may be shaped to enhance strength and/or structural integrity. For example, the heat-transfer fin may include one or more ribs that extend from a proximal surface of the fin toward a distal surface of the fin. The rib may be configured to resist deformation of the heat-transfer fin. An interlocking mechanism, as described herein, may also enhance the strength and/or structural integrity of the series of the heat-transfer fins.

Embodiments of the receptacle assembly may be similar to one or more industry standards. For example, the receptacle assemblies may be physically configured (e.g., sized and shaped) to satisfy industry standards for small-form factor pluggable (SFP), enhanced SFP (SFP+), quad SFP (QSFP), a microQSFP, C form-factor pluggable (CFP), and 10 Gigabit SFP, which is often referred to as XFP, or other small-form factor standards. The term "SFP-type systems" includes, but is not limited, the above industry standards. SFP-type systems include receptacle assemblies that are configured to receive input/output pluggable transceivers. SFP-type systems also include host devices (e.g., integrated circuits, processors, and the like) that communicate with the receptacle assembly and pluggable transceiver. The receptacle assemblies may be mounted to a host circuit board. For example, the host device may be an application specific integrated circuit (ASIC) that is configured to communicate with each of the receptacle connectors. The ASIC may constitute a serializer/deserializer (SerDes) interface.

The pluggable transceivers and corresponding receptacle assemblies may be capable of implementing one or more communication protocols including, but not necessarily limited to, Ethernet, Fibre Channel, InfiniBand, and Synchronous Optical Networking (SONET)/Synchronous Digital Hierarchy (SDH). The pluggable transceiver is configured to engage a communication cable and may be a direct attach copper (DAC) transceiver, an active optical cable (AOC) transceiver, or an optical transceiver (Txcvr).

Figure 1:
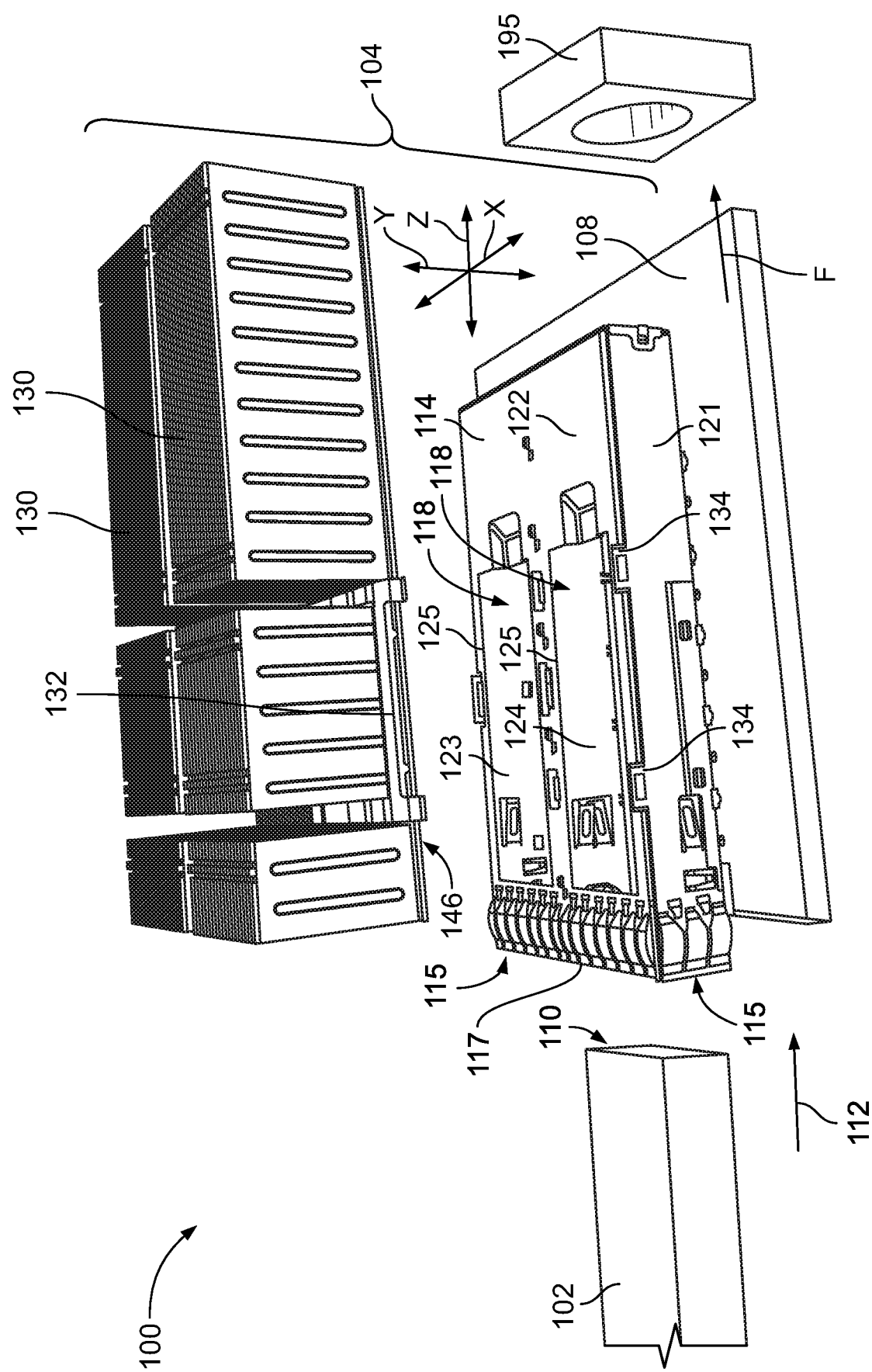
FIG. 1 is a perspective view of a portion of a communication system in accordance with an embodiment that includes a pluggable transceiver and a receptacle assembly.

FIG. 1 is a perspective view of a portion of a communication system 100 in accordance with an embodiment. The communication system 100 includes a pluggable transceiver 102 and a receptacle assembly 104. The communication system 100 may also include a host device (not shown) as described above. The receptacle assembly 104 is mounted to a circuit board 108. The communication system 100 is oriented with respect to mutually perpendicular X, Y, and Z axes. It should be understood that the Y-axis does not necessarily extend parallel to a gravitational force direction.

The pluggable transceiver 102 has a leading end 110 and a trailing end (not shown). The loading end is secured to or removably coupled to a cable (not shown) that communicates electrically and/or optically with the pluggable transceiver. The leading end 110 leads the pluggable transceiver 102 during a mating operation in which the pluggable transceiver 102 is moved along a mating direction 112 that is parallel to the Z-axis.

As shown, the receptacle assembly 104 includes a receptacle cage 114 that is mounted to the circuit board 108, which, in turn, may be mounted in a host system such as a router or server (not shown). The receptacle cage 114 includes two receiving cavities 118, although other embodiments may include only one receiving cavity or more than two receiving cavities. The host system may include a conductive chassis having a bezel (not shown) with openings (not shown) that align with respective receiving cavities 118. The receiving cavities 118 open to a front end 117 of the receptacle cage 114. More specifically, the front end 117 includes openings 115 to the receiving cavities 118. Each of the receiving cavities 118 is sized and shaped tor receive a corresponding pluggable transceiver. As shown, the pluggable transceiver 102 may be inserted into one of the receiving cavities 118 through the respective opening 115. Optionally, the receptacle assembly 104 is electrically connected to the bezel.

Figure 2:
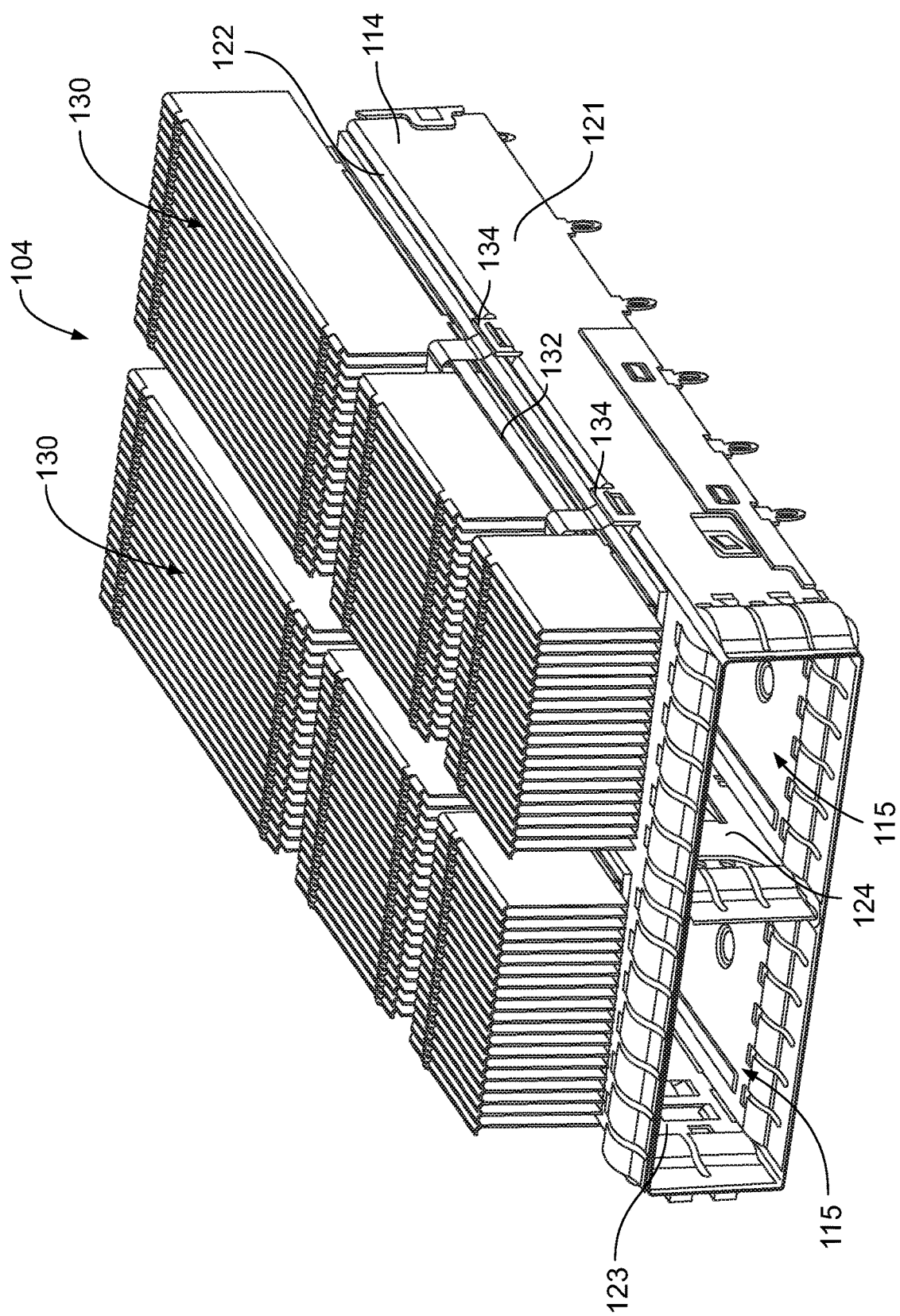
FIG. 2 is a perspective view of the receptacle assembly of FIG. 1 in accordance with embodiment.

FIG. 2 is a perspective view of the receptacle assembly 104. As shown in FIGS. 1 and 2, the receptacle cage 114 includes a plurality of walls 121-124 that define the receiving cavities 118 of the receptacle cage 114. The walls include first and second sidewalls 121, 123 that face in opposite directions along the X-axis. The receptacle cage 114 also includes an internal wall 124. The internal wall 124 divides a larger cavity of the receptacle cage 114 into the two receiving cavities 118. The receptacle cage 114 also includes a wall 122 that extends between the first and second sidewalls 121, 123. The wall 122 is hereinafter referred to as the thermal side (or top side) 122 of the receptacle cage 114 because the thermal side 122 couples to or interfaces with one or more thermal-transfer modules 130. In the illustrated embodiment, the thermal side 122 includes openings 125 (FIG. 1). Each opening 125 allows access to one of the receiving cavities 118 and is configured to accommodate a portion of one of the thermal-transfer modules 130.

The receptacle cage 114 is conductive and may be configured to reduce electromagnetic interference (EMI) emissions. For example, at least a portion of the receptacle cage 114 may be stamped-and-formed from conductive sheet material (e.g., sheet metal). The receptacle cage 114 may, however, be formed through other methods.

The thermal-transfer module 130 is positioned to make physical contact with the pluggable transceiver 102 when the pluggable transceiver 102 is installed into the receptacle assembly 104. A retention clip 132 secures one of the thermal-transfer modules 130 to the receptacle cage 114. Although not shown, another retention clip may secure the other thermal-transfer module to the receptacle cage 114. As shown, the receptacle cage 114 also includes tabs 134 positioned along the first sidewall 121. The tabs 134 receives a portion of the retention clip 132.

The retention clip 132 ensures that the corresponding thermal-transfer module 130 is pressed against the corresponding pluggable transceiver 102 (FIG. 1) to facilitate thermal transfer from the pluggable transceiver 102 to the thermal-transfer module 130. Each thermal-transfer module 130 includes an engagement surface 146 (shown in FIG. 1) that faces and may be positioned partially within a corresponding receiving cavity 118. The retention clip 132 may provide a resilient force that presses the engagement surface 146 against the corresponding pluggable transceiver 102.

Optionally, the communication system 100 may include an airflow instrument 195, such as a fan. The airflow instrument 195 may be configured to direct a flow of air (indicated by an arrow F) in a designated direction. The air may be ambient air or a designated composition with one or more gases. In the illustrated embodiment, the flow of air F is parallel to the Z-axis. In other embodiments, the flow of air may be in another direction, such as along the X-axis.

Figure 3:
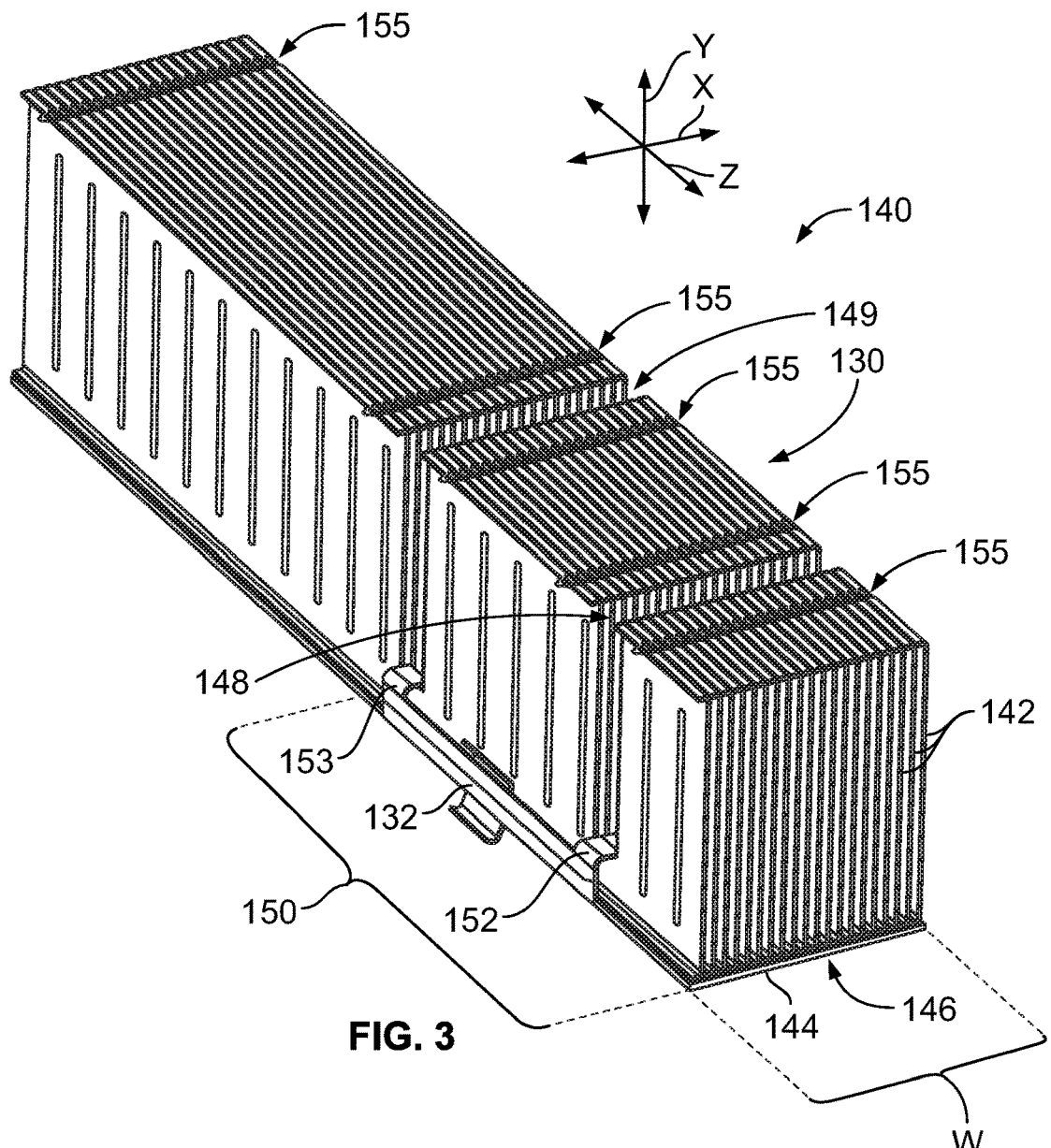
FIG. 3 is an isolated view of an assembly that includes a thermal-transfer module and a retention clip that may be used with the receptacle assembly of FIG. 1.

FIG. 3 is an isolated view of a thermal-transfer assembly 140 that includes one of the thermal-transfer modules 130 and one of the retention clips 132. Optionally, a thermal-transfer assembly may include one or more thermal-transfer modules and/or one or more retention clips. For example, in other embodiments, multiple retention clips may secure multiple thermal-transfer modules to a single receptacle cage. In another embodiment, a single retention clip may couple multiple thermal-transfer modules to a single receptacle cage (or multiple cages). In another embodiment, a single thermal-transfer module may be coupled to a single cage (or multiple cages) through multiple retention clips.

As shown, the thermal-transfer module 130 includes a plurality of heat-transfer fins 142 and a base portion 144. In the illustrated embodiment, the heat-transfer fins 142 are discrete fins that are interlocked in a zipper-like manner along five (5) paths 155 (referred to herein as interlocked paths 155). Each of the interlocked paths 155 extends along the X-axis across an entire width W of the thermal-transfer module. In other embodiments, the interlocked paths 155 may extend across only a portion of the width W. For embodiments in which the heat-transfer fins extend along the X-axis, the interlocked paths 155 may extend the Z-axis.

In the illustrated embodiment, the base portion 144 is discrete with respect to the heat-transfer fins 142. In other words, the base portion 144 is a separate element that is secured to the heat-transfer fins 142. The heat-transfer fins 142 may be secured to the base portion 144 through, for example, an adhesive or metallurgical bond. The base portion 144 includes the engagement surface 146 that is configured to intimately engage the pluggable transceiver 102 for transferring thermal energy therebetween.

The heat-transfer fins 142 and the base portion 144, however, may be formed through other methods. For example, the heat-transfer fins 142 may be formed by bonding, skiving or scarfing, folding, or other methods. The base portion 144 may be machined or extruded. Optionally, a base portion may also be part of the receptacle cage. For example, the heat-transfer fins may be directly attached to a wall of the receptacle cage that directly engages the pluggable transceiver. In this example, the wall of the receptacle cage forms the base portion of the thermal-transfer module. Accordingly, the thermal-transfer module may include a single piece of material or multiple parts that are coupled to one another. For embodiments that include multiple parts, one or more of the parts may be shared with other elements, such as the receptacle cage.

Optionally, the heat-transfer fins 142 may collectively form valleys 148 and 149. The valleys 148, 149 receive respective resilient beams 152, 153 of the retention clip 132. The valleys 148, 149 are positioned over a forward section 150 of the base portion 144. The forward section 150 is configured to directly engage the pluggable transceiver 102 at regions that conduct greater amounts of thermal energy. The forward section 150 has a greater thickness than other sections of the base portion 144.

Figure 4:
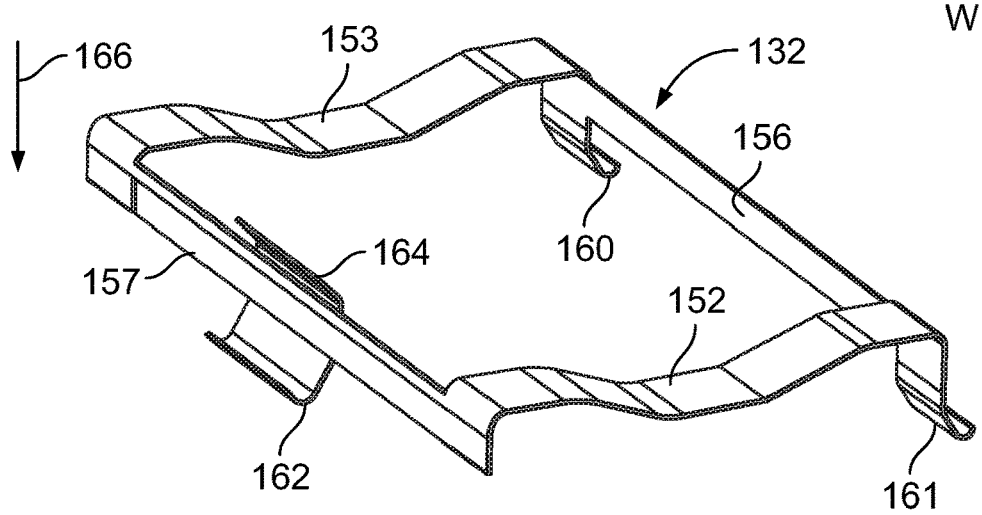
FIG. 4 is an isolated view of the retention clip that may be used with the receptacle assembly of FIG. 1.

FIG. 4 is an isolated view of the retention clip 132. The retention clip 132 includes the resilient beams 152, 153 and clip bridges 156, 157 that extend between and attach the resilient beams 152, 153. The clip bridges 156, 157 extend longitudinally and parallel to the Z-axis (FIG. 1). The resilient beams 152, 153 extend laterally and parallel to the X axis (FIG. 1). In the illustrated embodiment, the retention clip 132 is a single part that includes multiple resilient beams. In other embodiments, the retention clip 132 may be multiple parts. For example, the resilient beams may be separate. For other embodiments in which the heat-transfer fins extend lengthwise along the X-axis, the clip bridges may extend longitudinally along the X-axis and the resilient beams may extend laterally along the Z axis.

The resilient beams 152, 153 may be shaped to resist bending or flexing. When flexed, however, the resilient beams 152, 153 may provide a resilient force (as indicated by arrow 166) for urging the thermal-transfer module 130 (FIG. 1) toward the pluggable transceiver 102 (FIG. 1).

Also shown in FIG. 4, the retention clip 132 includes grip extensions 160-162 and a spacer extension 164. The grip extensions 160-162 are configured to attach the retention clip 132 to the receptacle cage 114 (FIG. 1). The spacer extension 164 is configured to engage another thermal-transfer module to ensure that the adjacent thermal-transfer modules are spaced apart. The grip extensions 160, 161 extend from the clip bridge 156, and the grip extension 162 extends from the clip bridge 157. The spacer extension 164 extends from the clip bridge 157.

Figure 5:
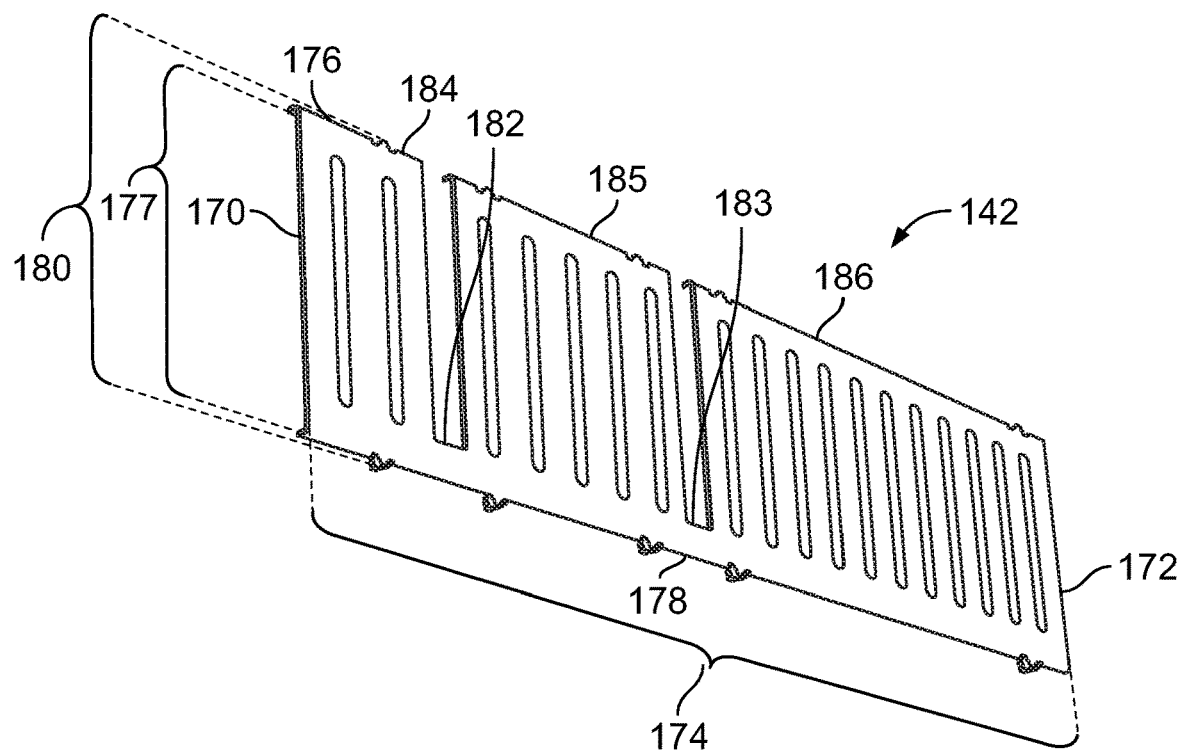
FIG. 5 is an isolated view of a single heat-transfer fin that may be used with the receptacle assembly of FIG. 1.

FIG. 5 is an isolated view of a single heat-transfer fin 142. In the illustrated embodiment, the heat-transfer fin 142 is stamped-and-formed from sheet material to include the features described herein. The heat-transfer fin 142 includes opposite end edges 170, 172 and a fin length 174 extending therebetween. The heat-transfer fin 142 includes a distal surface 176, a proximal surface 178, and a fin height 180 extending therebetween. An upright section 177 of the heat-transfer fin 142 extends between the distal and proximal surfaces 176, 178. The upright section 177 may be essentially planar and form a majority of the heat-transfer fin 142. In other embodiments, the upright section may have a non-planar contour along the Y-axis and/or a non-planar contour along the Z-axis.

The distal surface 176 represents a surface of the heat-transfer fin 142 that is furthest from the proximal surface 178 or the receptacle cage 114 (FIG. 1). The distal surface may include, for example, an edge of the heat-transfer fin (e.g., a stamped edge) or an outer surface along a folded or curved section of the heat-transfer fin. For embodiments in which the heat-transfer fins are portions of a continuous wave-like structure, the distal surface is the outer surface of a crest that joins two heat-transfer fins. In the illustrated embodiment of FIGS. 1-8, the distal surface is an outer surface along a folded section. In other embodiments, such as the embodiment of FIG. 10, the distal surface is an edge that is furthest from the receptacle cage.

In some embodiments, the distal surface 176 has a non-linear shape along the Z-axis (FIG. 1). More specifically, the distal surface 176 may be shaped to from one or more depressed segments and one or more elevated segments. For example, the heat-transfer fin 142 of FIG. 5 includes depressed segments 182, 183 and elevated segments 184-186. The fin height 180 along the elevated segments 184-186 is greater than the fin height 180 along the depressed segments 182, 183. The depressed segments 182, 183 and the elevated segments 184-186 of the different heat-transfer fins 142 may align to collectively form the valleys 148, 149 (FIG. 3) of the thermal-transfer module 130 (FIG. 1). The valleys 148, 149 are passages through which the resilient beams may extend through.

FIG. 6 is an enlarged view of a portion of the heat-transfer fin 142. In some embodiments, the heat-transfer fins include shaped features that enhance the strength and/or structural integrity of the heat-transfer fin 142. For example, the distal surface 176 of the heat-transfer fin 142 is defined by folded sections 210, 212 that are separated by an intra-fin gap 206. The folded sections 210, 212 may enhance the strength and/or structural integrity of the heat-transfer fin 142. The intra-fin gap 206 may align with other intra-fin gaps 206 to form the valley 148 (FIG. 3). In the illustrated embodiment, the distal surface 176 of the heat-transfer fin includes outwardly-facing side surfaces 214, 216 of the folded section 210, 212, respectively.

Alternatively or in addition to the folded sections, embodiments may include elongated indentations or ribs 220 that extend along the upright section 177 between the distal surface 176 and the proximal surface 178 of the heat-transfer fin 142. The elongated indentations 220 extend along a vertical axis 222. The elongated indentations 220 resist a force in a direction 224 that is from the distal surface 176 and toward the proximal surface 178 or toward the receptacle cage 114.

In some embodiments, the heat-transfer fins include features that directly engage other fins for interlocking with one another. For example, the heat-transfer fin 142 includes a key extension 200 and a key projection 201 along the elevated segment 184 and also includes a key extension 202 and a key projection 203 along the elevated segment 185. The key extensions 200, 202 are shaped portions of the corresponding folded sections 210, 212. The key projections 201, 203 are projections of the heat-transfer fins 142. Each of the key extensions 200, 202 includes a hole 205 that is sized and shaped to receive the respective key projection. The key extensions 200, 202 and the key projections 201, 203 may cooperate with other key extensions 200, 202 and the key projections 201, 203 of the other heat-transfer fins 142 as described with respect to FIGS. 7 and 8. Also shown in FIG. 6, the heat-transfer fin 142 has a thickness 208.

Figure 7:
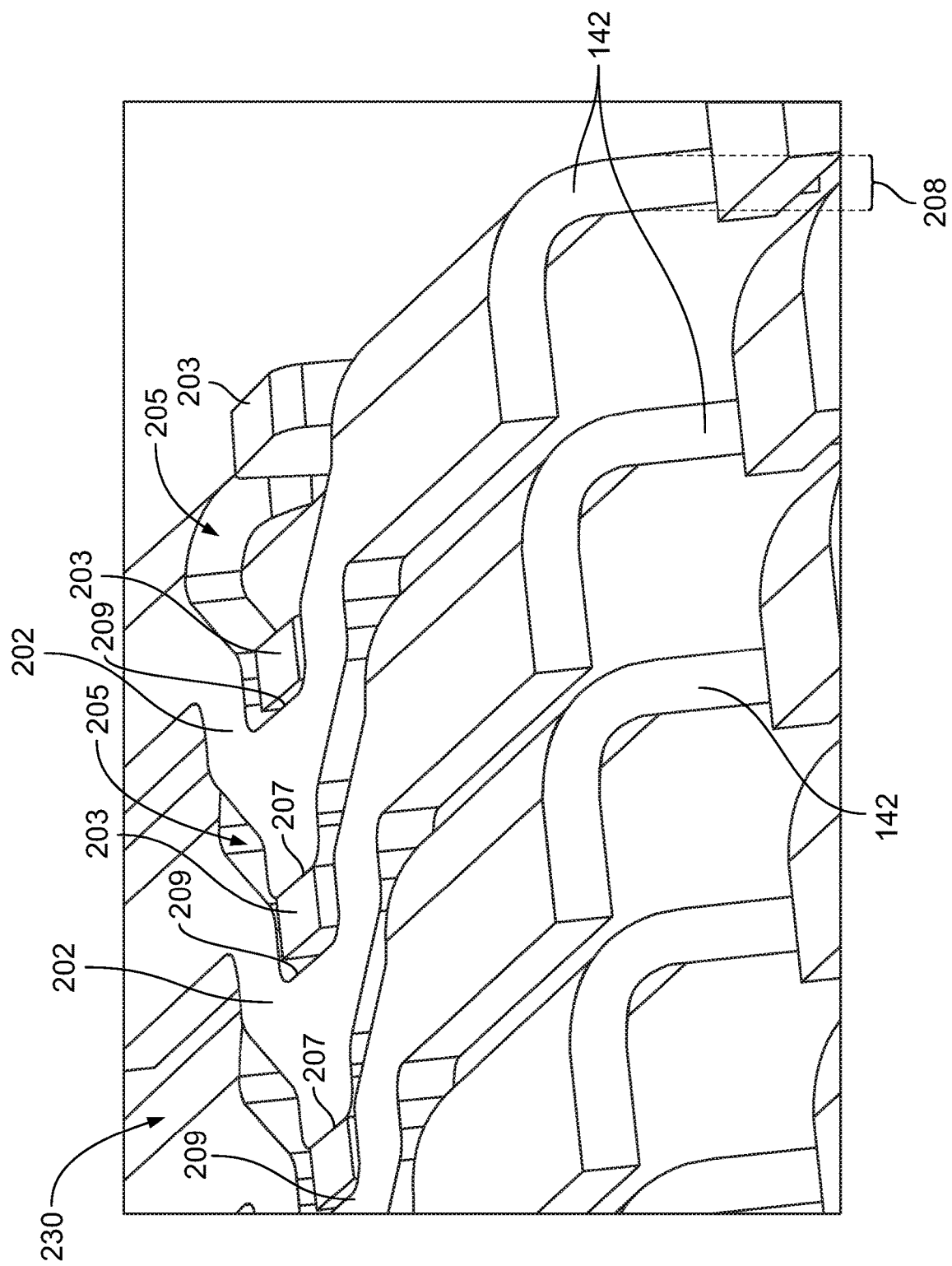
FIG. 7 illustrates an interlocking mechanism formed by a series of the heat-transfer fins.

FIG. 7 illustrates an interlocking mechanism 230 formed by a series of the heat-transfer fins 142. The following description is with respect to the key extensions 202 and the key projections 203. It should be understood, however, that the description may also be applicable to the key extensions 200 (FIG. 6) and the key projections 201 (FIG. 6) in addition to other key extensions and key projections. As shown in FIG. 7, each of the key extensions 202 receives the key projection 203 within the hole 205 from the adjacent heat-transfer fin 142. Also shown, an outer edge 207 of the key extensions 202 may abut the key projection 203 of the adjacent heat-transfer fin 142. As such, each of the key projections 203 (except for the key projection on the outer-most heat-transfer fin) is positioned between the outer edge 207 and an inner edge 209 of the adjacent key extension 202. The inner edge 209 partially defines the hole 205 of the corresponding key extension 202.

Accordingly, the key extensions 202 and key projections 203 from multiple heat-transfer fins 142 align and interlock with one another along an interlocked path 155. Thus, in some embodiments, the interlocked path 155 is an alternating series of the key extensions 202 and key projections 203 and may form an approximately level surface. Although the interlocking mechanism 230 was described with specific reference to key extensions and key projections having particular shapes, it should be understood that the key extensions and key projections may have other shapes. It should also be understood that other shaped features of the heat-transfer fins may be used as part of an interlocking mechanism.

It is also contemplated that, in other embodiments, a heat-transfer fin may not couple to the adjacent heat-transfer fin and/or may couple to a non-adjacent heat transfer fin. For example, a heat-transfer fin may engage one or more nearby heat-transfer fins. As described above, a nearby heat-transfer fin is a heat-transfer fin that is either one, two, or three positions away from the heat-transfer fin at issue. In such embodiments, a key extension (or other shaped feature) may extend across at least one heat-transfer fin to engage another heat-transfer fin.

Figure 8:
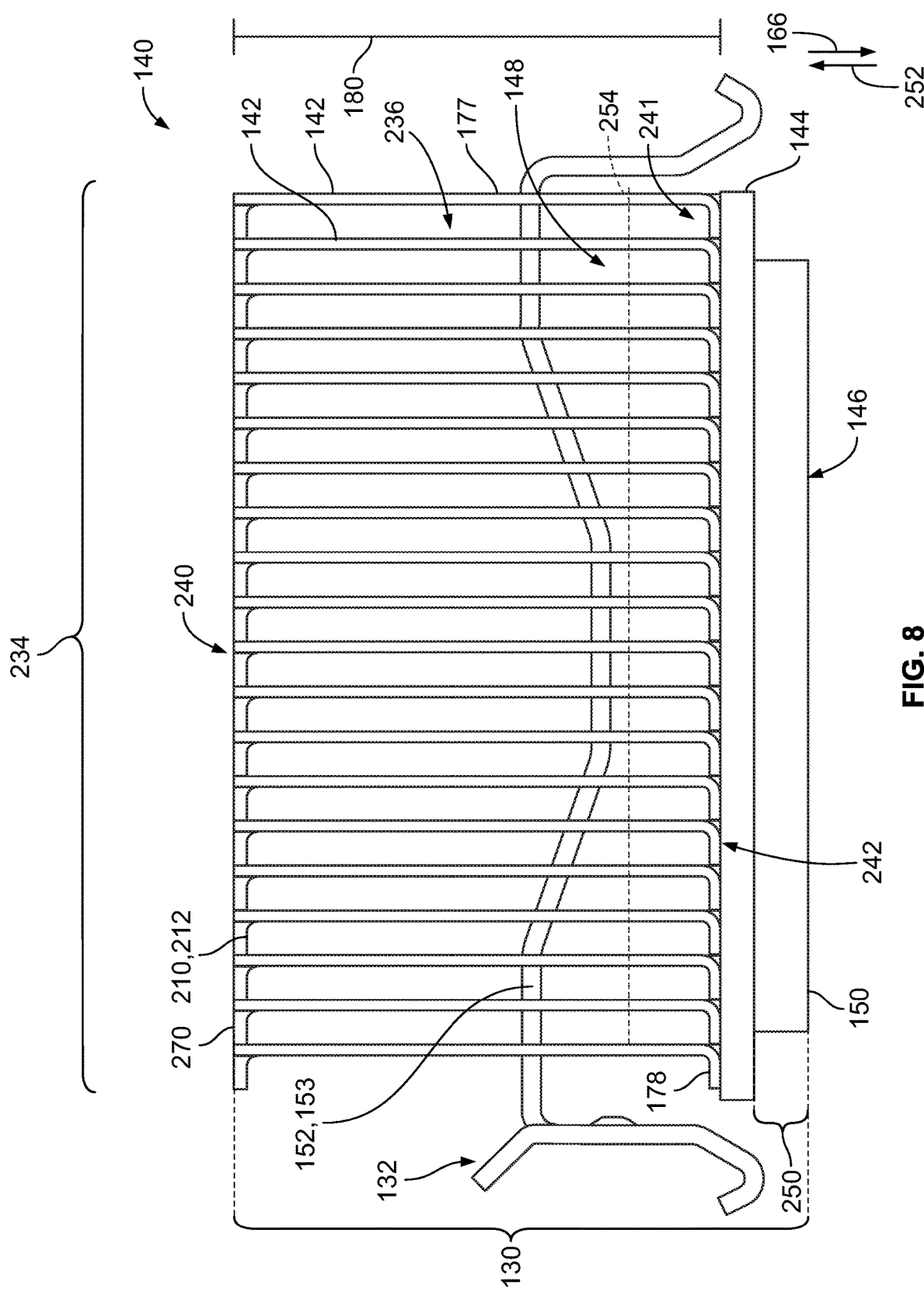
FIG. 8 is an end view of the assembly that may be used with the receptacle assembly of FIG. 1.

FIG. 8 is an end view of a fully constructed thermal-transfer assembly 140 including the thermal-transfer module 130 and the retention clip 132. The heat-transfer fins 142 are secured to one another as a collected group 234 by the interlocking mechanisms 230. The folded sections 210, 212 of the heat-transfer fins 142 combine to form a top or ceiling 240 of the thermal-transfer module 130. Optionally, interlocking mechanisms 241 may also be formed along the proximal surfaces 178 and the base portion 144. The interlocking mechanisms 241 may be similar or identical to the interlocking mechanisms 230. The heat-transfer fins 142 may also include folded sections that combine to form a bottom 242 of the collected group 234. The bottom 242 may be secured to the base portion 144 through an adhesive or solder. In other embodiments, the heat-transfer fins do not collectively form a bottom, but the heat-transfer fins may be secured individually to the base portion 144 in other manners.

As used herein, a series of heat-transfer fins may include all of the heat-transfer fins of a thermal-transfer module or less than all of the heat-transfer fins. For example, the thermal-transfer module may include a series of heat-transfer fins. The series may include five heat-transfer fins, but the thermal-transfer module may have, for example, ten heat-transfer fins.

The forward section 150 of the base portion 144 may have a thickness 250 that is greater than a thickness of the other sections of the base portion 144. When the receptacle assembly 104 is fully constructed, the forward section 150 may extend into the receiving cavity 118 (FIG. 1). As the pluggable transceiver 102 (FIG. 1) is inserted into the receiving cavity 118, the pluggable transceiver 102 engages the engagement surface 146 of the thermal-transfer module 130. The engagement surface 146 may be shaped to permit the thermal-transfer module 130 to be deflected in a lift direction 252. As the thermal-transfer module 130 is lifted or raised, the resilient beams 152, 153 may apply the resilient force 166 that resists, but permits, the thermal-transfer module 130 to be raised. During operation, the pluggable transceiver 102 remains within the receiving cavity 118 and the resilient beams 152, 153 remain deflected, thereby constantly applying the resilient force 166. As such, the thermal-transfer module 130 may be intimately engaged to the pluggable transceiver along the engagement surface 146.

In the illustrated embodiment, the retention clip 132 applies the resilient force 166 directly to the heat-transfer fins 142, unlike known clips. The resilient force 166 is applied at troughs 254 of the valley 148, 149. The troughs 254 are collectively formed by the aligned depressed segments 182, 183 (FIG. 5). At the troughs 254 of the valleys 148, 149, the fin height 180 of the heat-transfer fins 142 is significantly reduced. The shortened portions of the heat-transfer fins 142 may better resist deformation than portions that have a greater height.

In other embodiments, the resilient beams may directly engage the heat-transfer fins in other manners. For example, it is contemplated that the resilient beams may directly engage the interlocking mechanism along the interlocked paths. The resilient beams may also engage the heat-transfer fins at different points, other than the distal surface. Yet in other embodiments, the resilient beams may directly engage a surface of the base portion without engaging the heat-transfer fins.

Adjacent heat-transfer fins 142 define corresponding airflow gaps 236 therebetween or, more specifically, between the upright sections 177 of the heat-transfer fins. During operation, forced air may be directed through the airflow gaps 236. The thermal energy within the heat-transfer fins 142 may be dissipated into the surrounding environment and directed away from the heat-transfer fins 142 by the forced air.

Figure 9:
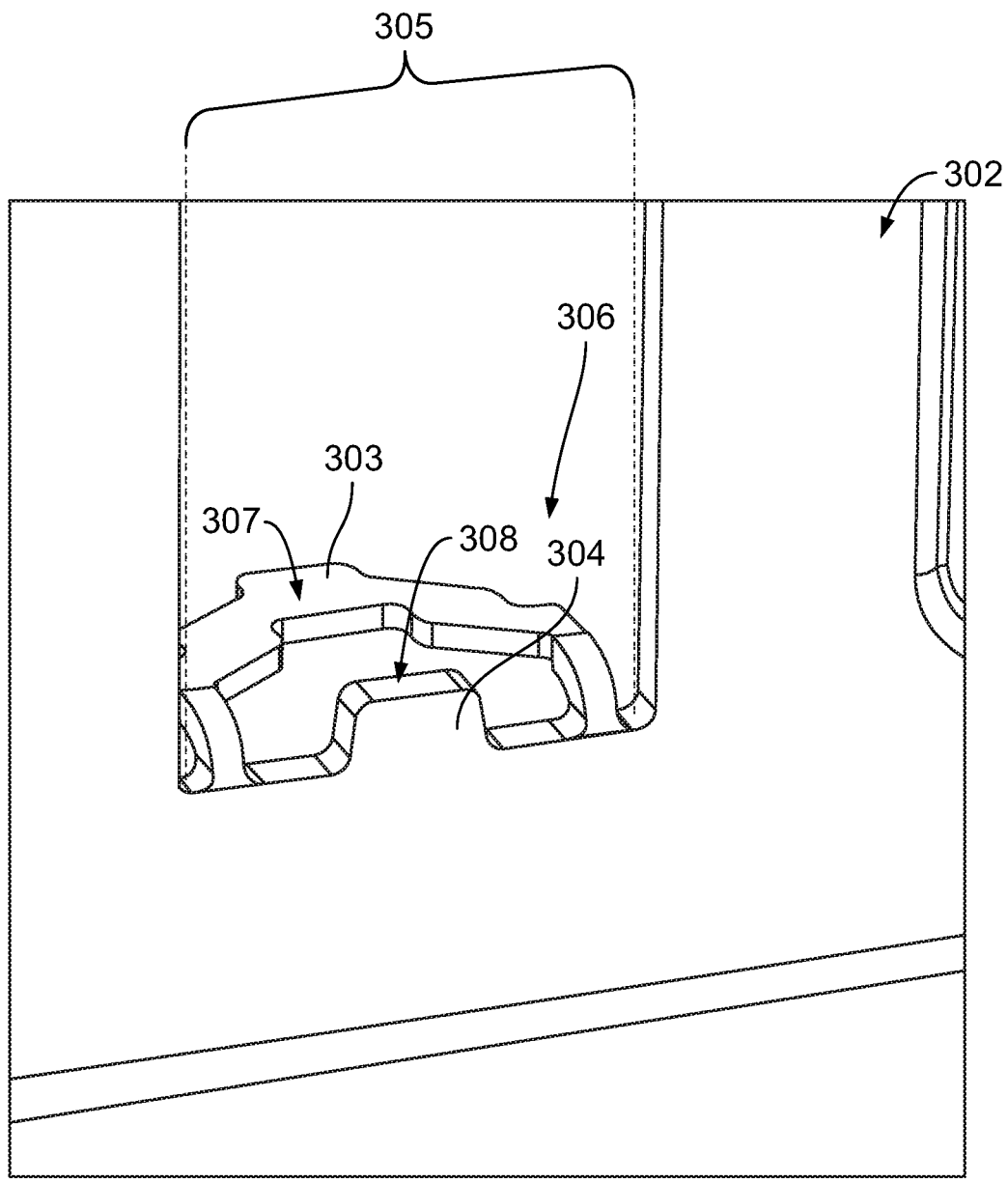
FIG. 9 is an enlarged view of a portion of a heat-transfer fin in accordance with an embodiment.

FIG. 9 illustrates an enlarged portion of a heat-transfer fin 302, which may be similar to the heat-transfer fin 142 (FIG. 3). Unlike the heat-transfer fin 142, the heat-transfer fin 302 includes a key extension 303 and a key projection 304 that extend along a depressed segment 305 of the distal surface 306. In the illustrated embodiment, the distal surface 306 includes an outer side surface 307 of the key extension 303 and an edge 308 of the key projection 304. Similar to the embodiment of FIG. 7 and the embodiment of FIG. 10, the key extensions 303 and key projections 304 from multiple heat-transfer fins 302 may align and interlock with one another along an interlocked path (not shown). The interlocked path is an alternating series of the key extensions and key projections and may form an approximately level surface. Optionally, the level surface may be configured to engage the retention clip.

Figure 10:
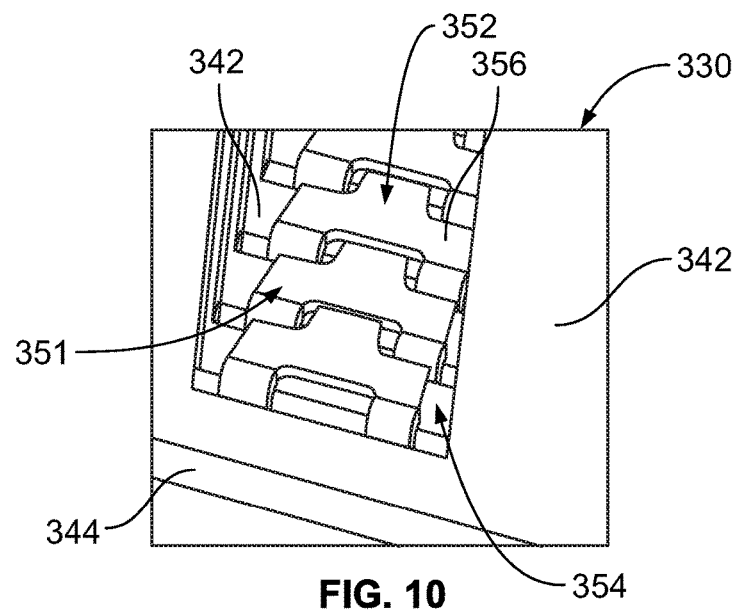
FIG. 10 is an enlarged view of a portion of an assembly that may be used with the receptacle assembly of FIG. 1.

FIG. 10 is an enlarged view of a portion of thermal-transfer module 330 that may be used with the receptacle assembly 104 (FIG. 1). The thermal-transfer module 330 may have elements that are similar or identical to the thermal-transfer module 130 (FIG. 1). For example, the thermal-transfer module 130 includes a base portion 344 and a plurality of heat-transfer fins 342. Unlike the heat-transfer fins 142 (FIG. 1), the heat-transfer fins 342 are configured to form interlocking mechanisms 350 along a bottom 352 of a valley 354. The valley 354 is similar to the valley 148 (FIG. 3). More specifically, the heat-transfer fins 342 includes key extensions 356 that are folded to grip features of the adjacent heat-transfer fin 342. The interlocking mechanisms 350 form an interlocked path 351 that extends across the thermal-transfer module. In other embodiments, the heat-transfer fins 342 may have key extensions or projections that are identical to the key extensions 200, 202 (FIG. 7) and key projections 201, 203 (FIG. 7). For embodiments similar to FIG. 10, the resilient beams of the retention clip (not shown) may directly engage the interlocking mechanisms 350.

Figure 11:
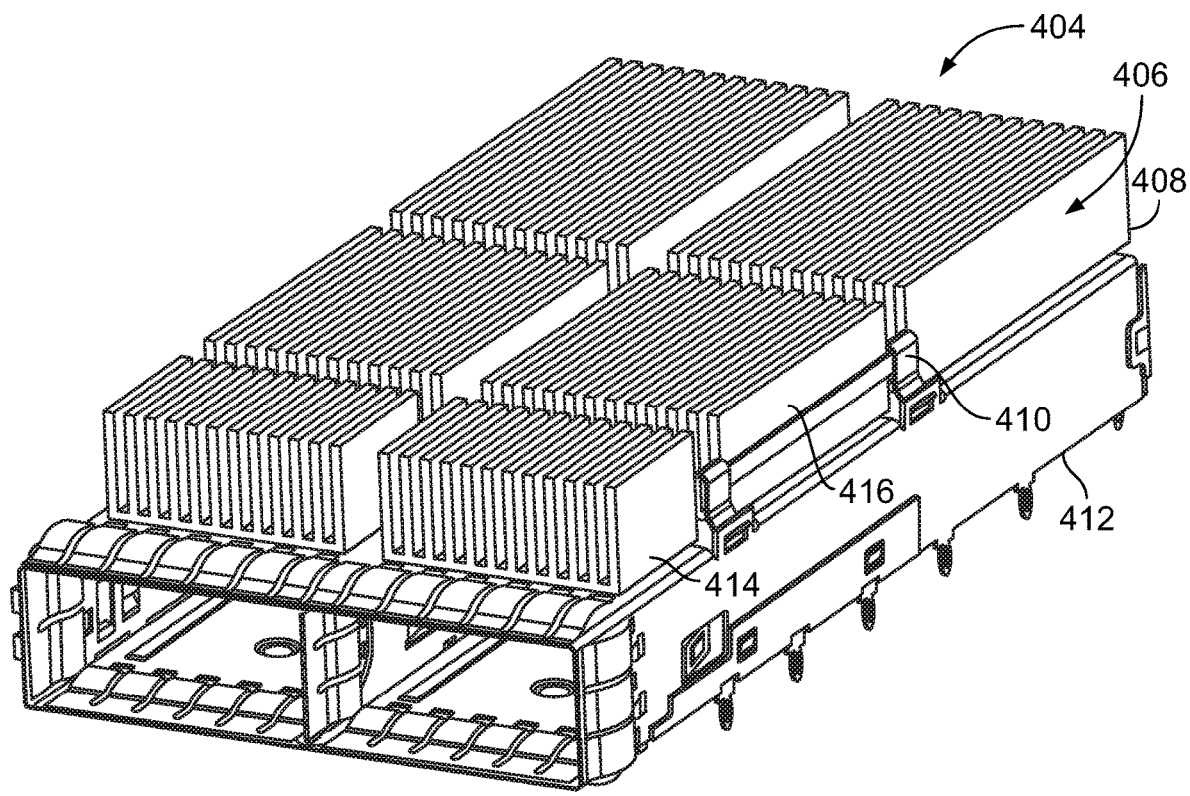
FIG. 11 is a perspective view of a receptacle assembly in accordance with an embodiment.

FIG. 11 is a perspective view of a receptacle assembly 404 in accordance with an embodiment. The receptacle assembly 404 may have elements that are similar or identical to the elements of the receptacle assembly 104 (FIG. 1). For example, the receptacle assembly 404 includes a thermal-transfer assembly 406 having a thermal-transfer module 408 and a retention clip 410. The receptacle assembly 404 also includes a receptacle cage 412. The receptacle cage 412 may be similar or identical to the receptacle cage 114 (FIG. 1).

The thermal-transfer module 408 also includes a base portion 414 and a plurality of heat-transfer fins 416. Unlike the thermal-transfer module 130 (FIG. 1), the base portion 414 and the heat-transfer fins 416 are portions of single piece of material. As such, the thermal-transfer module 408 may be a single piece of material that is shaped to include the base portion 414 and the heat-transfer fins 416. The thermal-transfer module 408 may be movable coupled to the receptacle cage 412.

Figure 12:
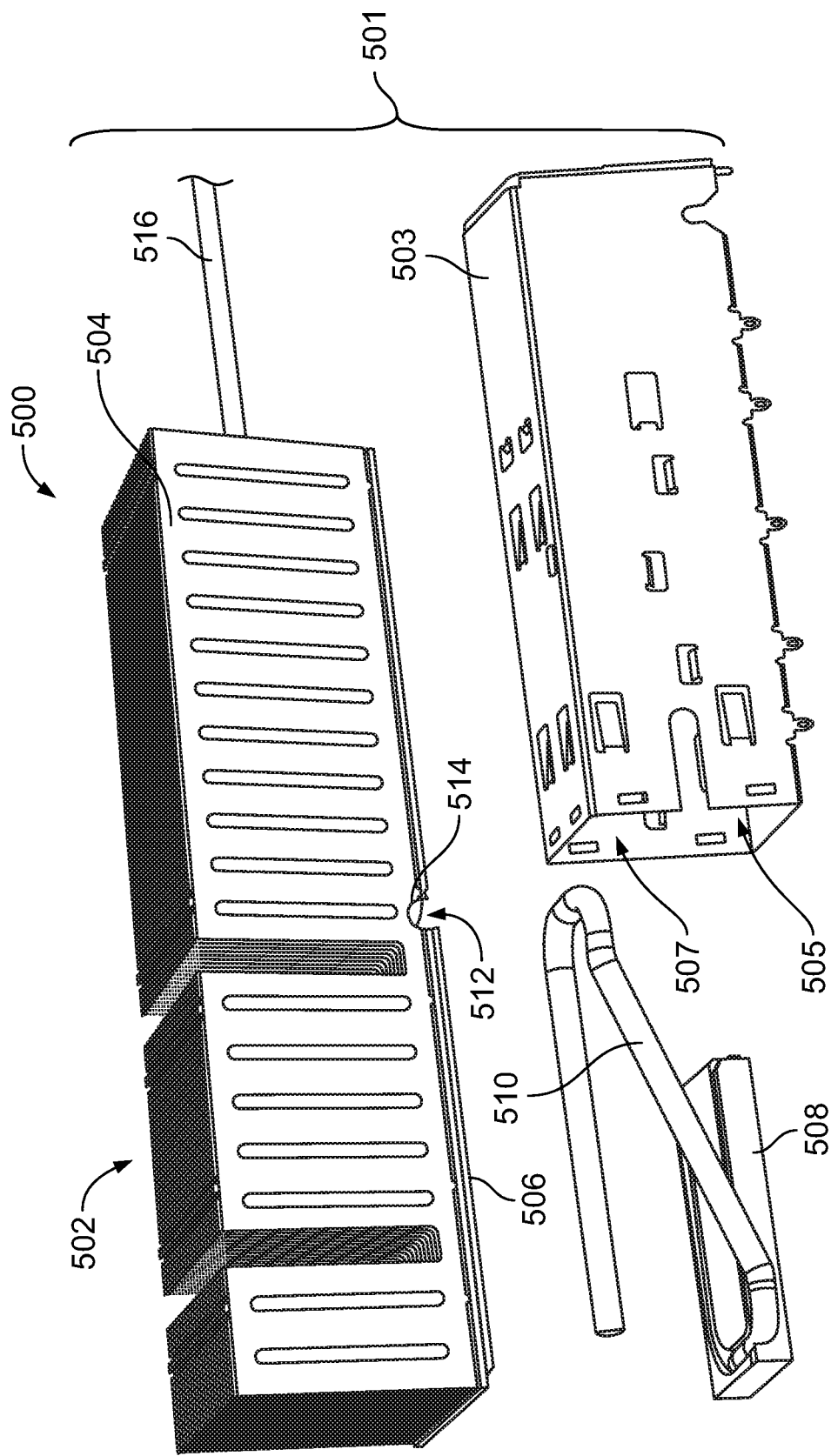
FIG. 12 is an isolated view of an assembly that includes a thermal-transfer module and thermal-transfer conduits.

FIG. 12 is a perspective view of a thermal-transfer assembly 500 that includes a thermal-transfer module 502. The thermal-transfer module 502 may be similar or identical to the thermal-transfer modules described herein (e.g., the thermal-transfer module 130 (FIG. 1)). For example, the thermal-transfer module 502 includes a plurality of heat-transfer fins 504 and a base portion 506 Although not shown, the thermal-transfer assembly 500 may also include a retention clip, which may be similar or identical to the retention clip 132 (FIG. 1).

In some embodiments, the thermal-transfer assembly 500 may be part of a receptacle assembly 501 that includes a receptacle cage 503 having stacked receiving cavities 505, 507. The stacked receiving cavities 505, 507 may include, for instance, a first or bottom receiving cavity 505 that is positioned below a second or top receiving cavity 507. The pluggable transceiver (not shown) disposed within the bottom receiving cavity 505 would not be positioned adjacent to the base portion 506 of the thermal-transfer module 502. In such embodiments, the thermal-transfer assembly 500 includes a thermal-transfer plate 508 and a thermal-transfer bridge (or heat pipe) 510.

During operation, the pluggable transceiver disposed in the top receiving cavity 507 would be positioned between the thermal-transfer plate 508 and the base portion 506. The thermal-transfer plate 508 absorbs thermal energy from the pluggable transceiver in the bottom receiving cavity 505 and, potentially, also the pluggable transceiver in the top receiving cavity 507. Thermal energy is conducted through the thermal-transfer bridge 510 to the base portion 506 and/or the heat-transfer fins 504.

The thermal-transfer bridge 510 may couple to at least one of the base portion 506 or the heat-transfer fins 504. For example, an open-sided channel 512 may be formed within the base portion 506 and have an inlet 514. The thermal-transfer bridge 510 may be received within the channel 512.

Optionally, the thermal-transfer assembly 500 may include a transfer bridge 516. The thermal-transfer bridge 516 may couple to at least one of the base portion 506 or the heat-transfer fins 504. Similarly, a channel (not shown) may be formed within the base portion 506 and receive the thermal-transfer bridge 516. The thermal-transfer bridge 516 may transfer the thermal energy to a remote location away from the receptacle assembly.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112(f), unless and until such claim limitations expressly use the phrase "means for" followed by a statement of function void of further structure.

What is claimed is:

1. A receptacle assembly comprising:
a receptacle cage having a front end and a receiving cavity that opens to the front end, the receiving cavity being sized and shaped to receive a pluggable transceiver;
a thermal-transfer module being coupled to a side of the receptacle cage, the thermal-transfer module having a base portion and a plurality of heat-transfer fins coupled to the base portion; and
a retention clip configured to directly engage and hold the thermal-transfer module to the receptacle cage; and
wherein the thermal-transfer module is configured to absorb thermal energy from the pluggable transceiver and transfer the thermal energy through the base portion and to the heat-transfer fins, wherein the heat-transfer fins of said plurality have a thickness that is at most 0.40 mm;
wherein the receptacle cage includes an opening that permits the base portion of the thermal-transfer module to directly engage the pluggable transceiver, the base portion being configured to be displaced by the pluggable transceiver as the pluggable transceiver is inserted into the receptacle cavity, the heat-transfer fins moving with the base portion when the base portion is displaced.

2. The receptacle assembly of claim 1, wherein each of the heat-transfer fins of said plurality includes at least one elongated indentation along at least a section of the corresponding heat-transfer fin, the elongated indentations extending lengthwise away from the base portion and being configured to resist deformation of the corresponding heat-transfer fins of a force that is directed toward the base portion.

3. The receptacle assembly of claim 1, wherein the heat-transfer fins include an upright section that extends away from the receptacle cage and a folded section that extends transverse to the upright section.

4. The receptacle assembly of claim 3, wherein, for at least a series of the heat-transfer fins, the folded section for each of the heat-transfer fins in the series interlocks with one or more of the other heat-transfer fins in the series.

5. The receptacle assembly of claim 4, wherein the folded section for each of the heat-transfer fins in the series interlocks with an adjacent heat-transfer fin in the series.

6. The receptacle assembly of claim 4, wherein the folded section of each of the heat-transfer fins in the series includes a key extension that extends transverse to the upright section and a key projection that extends away from the base portion, the key extensions and the key projections interlocking with one another.

7. The receptacle assembly of claim 3, wherein the plurality of heat-transfer fins include a series of the heat-transfer fins, the folded section for at least one of the heat-transfer fins in the series having an outer edge that abuts one of the other heat-transfer fins in the series and an inner edge that abuts another of the heat-transfer fins in the series.

8. The receptacle assembly of claim 1, wherein the heat-transfer fins are stamped-and-formed heat-transfer fins.

9. The receptacle assembly of claim 1, wherein the heat-transfer fins are skived heat-transfer slices.

10. The receptacle assembly of claim 1, wherein the heat-transfer fins have a thickness that is at most 0.30 mm.

11. The receptacle assembly of claim 1, wherein the heat-transfer fins have corresponding fin heights that extend from the base portion to corresponding distal surfaces, the distal surfaces being shaped to form depressed segments and elevated segments, the fin height along the elevated segment being greater than the fin height along the depressed segment.

12. The receptacle assembly of claim 11, wherein the depressed segments collectively form a valley of the thermal-transfer module.

13. A thermal-transfer assembly comprising:
a thermal-transfer module configured to be coupled to a device, the thermal-transfer module having a base portion and a plurality of heat-transfer fins coupled to the base portion; and
a retention clip configured to directly engage and hold the thermal-transfer module to the device; and
wherein the thermal-transfer module is configured to absorb thermal energy from the device and transfer the thermal energy through the base portion and to the heat-transfer fins, wherein the heat-transfer fins of said plurality have a thickness that is at most 0.40 mm;
wherein the base portion has an engagement surface that is configured to directly engage the device, wherein each of the heat-transfer fins includes at least one elongated indentation along at least a section of the corresponding heat-transfer fin, the elongated indentations extending lengthwise away from the base portion and being configured to resist deformation of the corresponding heat-transfer fins from a force that is directed toward the base portion.

14. The thermal-transfer assembly of claim 13, wherein the heat-transfer fins include an upright section that extends away from the receptacle cage and a folded section that extends transverse to the upright section.

15. The thermal-transfer assembly of claim 14, wherein, for at least a series of the heat-transfer fins, the folded section for each of the heat-transfer fins in the series interlocks with one or more of the other heat-transfer fins in the series.

16. The thermal-transfer assembly of claim 13, wherein the heat-transfer fins are stamped-and-formed heat-transfer fins.

17. The thermal-transfer assembly of claim 13, wherein the heat-transfer fins are skived heat-transfer slices.

18. The thermal-transfer assembly of claim 13, wherein the heat-transfer fins have a thickness that is at most 0.30 mm.

19. A thermal-transfer assembly comprising:
a thermal-transfer module configured to be coupled to a device, the thermal-transfer module having a base portion and a plurality of heat-transfer fins coupled to the base portion; and
a retention clip configured to directly engage and hold the thermal-transfer module to the device; and
wherein the thermal-transfer module is configured to absorb thermal energy from the device and transfer the thermal energy through the base portion and to the heat-transfer fins, wherein the heat-transfer fins of said plurality have a thickness that is at most 0.40 mm;
wherein the heat-transfer fins have corresponding fin heights that extend from the base portion to corresponding distal surfaces, the distal surfaces, for at least a series of the heat-transfer fins of said plurality, being shaped to form depressed segments and elevated segments, the fin height along the elevated segment being greater than the fin height along the depressed segment; and
wherein, for at least the series of the heat-transfer fins, each of the depressed segments includes a folded section that extends toward and interlocks with one or more of the other heat-transfer fins in the series, the folded sections of the depressed segments collectively forming a valley of the thermal-transfer module.

20. The thermal-transfer assembly of claim 19, wherein the heat-transfer fins of said plurality have an average thickness of at most 0.30 mm.

* * * * *